United States Patent [19]

Bales et al.

[11] Patent Number: 4,918,382
[45] Date of Patent: Apr. 17, 1990

[54] METHOD FOR DISTINGUISHING BETWEEN REAL AND SPURIOUS RESPONSES IN A SPECTRUM ANALYZER

[75] Inventors: Robert W. Bales; Joan E. Bartlett, both of Portland, Oreg.

[73] Assignee: Tektronix, Inc., Beaverton, Oreg.

[21] Appl. No.: 325,845

[22] Filed: Mar. 20, 1989

[51] Int. Cl.⁴ ............................................. G01R 23/16
[52] U.S. Cl. ..................................... 324/77 B; 358/81
[58] Field of Search ................. 358/81, 82; 324/77 R, 324/77 B, 77 C, 77 CS, 77 E, 77 G, 121 R

[56] References Cited

U.S. PATENT DOCUMENTS

| | | | |
|---|---|---|---|
| 3,748,471 | 7/1973 | Ross et al. | 358/81 |
| 3,909,840 | 9/1975 | Takahashi | 358/81 |
| 4,426,648 | 1/1984 | Tsui et al. | 324/77 B |
| 4,568,878 | 2/1986 | Bales | 324/77 |
| 4,636,839 | 11/1987 | Cole et al. | 358/81 |
| 4,710,806 | 12/1987 | Iwai et al. | 358/81 |
| 4,768,086 | 8/1988 | Paist | 358/81 |

Primary Examiner—Michael J. Tokar
Attorney, Agent, or Firm—Boulden G. Griffith

[57] ABSTRACT

A method for distinguishing between real and spurious responses in a swept frequency spectrum analyzer in a convenient and on-going way uses sweep data from two different, but equivalent, paths through the spectrum analyzer front end. The setup of the spectrum analyzer front end continuously alternates between the first and second of these setups. A sweep of the spectrum using the first setup is digitized and stored, as well as displayed. The sweep obtained using the second setup is also digitized and stored, as well as displayed. However, at the same time that the current sweep data is being displayed, the stored sweep data from the previous sweep using the other setup is also displayed at the same location on the screen. At anyone time, there are two displays on the screen, overlaid with each other as exactly as possible. The two sweeps are displayed using different intensities or, preferably, using different colors, so that they may be distinguished from each other, and, more importantly, so that regions where they coincide appear different to the operator than regions where they do not coincide, thus permitting easy visual identification of real and spurious signals. Because there may be some variations in the gain/attenuation through the two setups of the front end, comparisons between the data of the two sweeps can be used to adjust the gain of one or both of the paths.

6 Claims, 2 Drawing Sheets

METHOD FOR DISTINGUISHING BETWEEN REAL AND SPURIOUS RESPONSES IN A SPECTRUM ANALYZER

BACKGROUND OF THE INVENTION

This invention relates to the field of spectrum analyzers, and more particularly to the field of differentiating between real and spurious responses from a spectrum analyzer.

Spectrum analyzers of the superheterodyne or swept-frequency type are based on the use of a mixer and a variable frequency local oscillator. The input signal to be analyzed is mixed with the output of a sweeping first local oscillator to produce a first intermediate frequency signal. Any incoming signal that mixes with a harmonic frequency of the sweeping first local oscillator produces an analyzer response. At any one time, however, the spectrum analyzer is calibrated for responses produced by mixing with only one of the harmonics of the sweeping first local oscillator. These responses are the "real" responses of the analyzer, while those produced by mixing with the other harmonics for which the analyzer is not presently calibrated are spurious.

For some types of spectrum analyzers within some frequency ranges, a fixed or tunable filter restricts the input to only the frequencies that produce real or calibrated responses. However, in other cases, it is necessary to do more to distinguish between the real and spurious responses.

Methods are known for distinguishing between the real and spurious responses of a spectrum analyzer. Typically, these methods rely on changing the setup of the spectrum analyzer's front end, so that real signals are shifted by a predicted amount, while spurious signals are shifted by some other amount. Creating these predictable shifts can be accomplished by changing the local oscillator frequencies and/or the bandpass of the filters. U.S. Pat. No. 4,568,878 describes the automation of such a process by a microprocessor, so that spurious signals are automatically eliminated from the display. Nonetheless, despite the availability of this method, some users prefer to identify real and spurious signals for themselves, not wishing to risk having the computer inadvertently discard data that they are interested in.

Another way to discriminate between real and spurious responses is to switch the first intermediate filter frequency and make a corresponding change to the second local oscillator frequency, such that the two changes cancel out for frequencies within the desired frequency range that are mixing with the desired harmonic of the first local oscillator, but do not cancel out for signals that are mixing with the wrong harmonic. This approach causes the real responses to maintain their original horizontal location when these changes are made, while spurious responses move to different horizontal locations.

A simplified version of a conventional superheterodyne spectrum analyzer is shown in FIG. 1. The input signal to be analyzed is received at an input terminal 2 and is mixed in a mixer 4 with the output signal of a sweeping local oscillator 6 at a frequency $F_{lo1}$ determined by oscillator tuning circuit 27 and swept by ramp generator 26. The output signal of the mixer 4 is applied to two fixed-frequency first I.F. filters 8 or 10, to produce an output signal at one of two intermediate frequencies $F_{if1a}$ or $F_{if1b}$. The output of 1st I.F. Filter-A 8 is applied to one port of mixer 12, where it is mixed with the output of second local oscillator A 15. The output of 1st I.F. Filter-B 10 is applied to one port of mixer 14, where it is mixed with the output of second local oscillator B 16. A switch 17 selects between the outputs of the two mixers 12, 14.

The output of the selected mixer 12 or 14 is applied to a second intermediate frequency filter and amplifier stage, including a fixed-frequency variable resolution filter 18 and and a log amplifier 20. The output of the second intermediate filter stage 18, 20 is detected by a detector 22 and applied to amplifiers and video processing circuitry (not shown) to a vertical information digitizing stage 24.

A ramp generator 26 generates a horizontal sweep ramp that is used to sweep the local oscillator 6 and also applied to a horizontal position information digitizer 28. The digital output of the horizontal position information digitizer 28 is representative of the instantaneous frequency of the local oscillator 10 and is used as address information by storage RAM 38 in storing vertical information, representing signal amplitude, derived from the vertical position information digitizer 24.

A second ramp generator 40 generates a digital ramp that drives the horizontal amplifier 32 and that also provides address information for reading out the vertical information stored in the storage RAM 38. The vertical amplitude information stored in the addressed memory locations of the storage stage 38 drives the vertical deflection amplifier 30 of the CRT 34. Consequently, the CRT 34 display represents variations in the power in the input signal (vertical axis) as a function of frequency (horizontal axis).

The overall operation of the analyzer is controlled by an internal computer 36 that has interactions with most of the parts of the analyzer, including those parts not shown in FIG. 1, to coordinate and control the functionality of the analyzer and to accept operator input through the user interface.

A response appears on the vertical axis of the analyzer display whenever the input signal includes a component at a frequency $F_s$ such that one of the following conversion equations is satisfied:

$$(M \times F_{lo1} - N \times F_s) - F_{lo2} = F_{if2} \quad (1)$$

$$(N \times F_s - M \times F_{lo1}) - F_{lo2} = F_{if2} \quad (2)$$

$$(N \times F_s + M \times F_{lo1}) - F_{lo2} = F_{if2} \quad (3)$$

$$F_{lo2} - (M \times F_{lo1} - N \times F_s) = F_{if2} \quad (4)$$

$$F_{lo2} - (N \times F_s - M \times F_{lo1}) = F_{if2} \quad (5)$$

$$F_{lo2} - (N \times F_s + M \times F_{lo1}) = F_{if2} \quad (6)$$

N and M represent the number of various harmonics and can only assume integer values. And, with input signal levels low, N can be assumed to be always equal to 1. It is also necessary that the quantity in parenthesis be within the passband of the first IF filter stage 8. The first intermediate frequency is selected such that either the first three or the last three conversions are not possible. The first IF frequency is less than the minimum value of the first (sweeping) local oscillator frequency $F_{lo1}$, so that conversions (3) and (6) are not possible. Thus, only an input signal $F_s$ that satisfies either of the following equations produces a signal on the display:

$$(M \times F_{lo1} - F_s) - F_{lo2} = F_{if2} \quad (1a)$$

$$(F_s - M \times F_{lo1}) - F_{lo2} = F_{if2} \quad (2a)$$

However, the analyzer is calibrated, at any one time, for only one of these two equations and a particular value of M, say $M_i$. Nevertheless, signals satisfying the other equation reach the display, where they are considered to be spurious because the frequencies indicated for them are always incorrect and the indicated amplitudes are also prone to error.

To check for spurious responses, the computer 36 can be programmed to change the position of switch 17 and the signals sent to the oscillator tuning circuit 27, thereby changing the frequency of the first local oscillator 6. One of the 1st I.F. filters 8,10 has a bandpass appropriate to one of the first local oscillator frequencies, while the other of the 1st I.F. filters has a bandpass appropriate to the other of the first local oscillator frequencies. Thus, there are two alternative paths through the spectrum analyzer front end that are both based on the same value of M (harmonic), but for different values of $F_{if2}$. The difference in the two 1st I.F. frequencies is then cancelled out by a difference in the frequencies of the second local oscillators 15,16, so that either input to the variable resolution filter 18 as selected by switch 17 is in the same frequency range.

Switching between these two alternative paths through the spectrum analyzer front end causes real responses to appear in the same place on the display, while spurious responses show up in different locations or do not appear on the display at all.

In the prior art, it has been known to use a second path through the analyzer front end to generate a second set of sweep data, to store that alternative sweep data, and to display that data from the alternative setup vertically offset from the current data by a predetermined amount to permit an operator to make a visual comparison between the two.

However, this visual comparison is susceptible to error, and, if the analyzer controls are being operated so that the display is affected, the stored reference sweep data is no longer useful. What is desired is a better way for an operator of a spectrum analyzer to make easy and on-going comparisons between the signals traveling through two setups of the spectrum analyzer front end.

SUMMARY OF THE INVENTION

Accordingly, the present invention is a method for distinguishing between real and spurious responses in a swept frequency spectrum analyzer in a convenient and on-going way. It relies on the use of sweep data from two different, but equivalent, paths through the spectrum analyzer front end. The setup of the spectrum analyzer front end continuously alternates between the first and second of these setups. A sweep of the spectrum using the first setup is digitized and stored, as well as displayed. The sweep obtained using the second setup is also digitized and stored, as well as displayed. However, at the same time that the current sweep data is being displayed, the stored sweep data from the previous sweep using the other setup is also displayed at the same location on the screen. At any one time, there are two displays on the screen, overlaid with each other as exactly as possible. The two sweeps are displayed using different intensities or, preferably, using different colors, so that they may be distinguished from each other, and, more importantly, so that regions where they coincide appear different to the operator than regions where they do not coincide, thus permitting easy visual identification of real and spurious signals. Because there may be some variations in the gain/attenuation through the two setups of the front end, comparisons between the data of the two sweeps can be used to adjust the gain of one or both of the paths.

DETAILED DESCRIPTION

Figure 2:
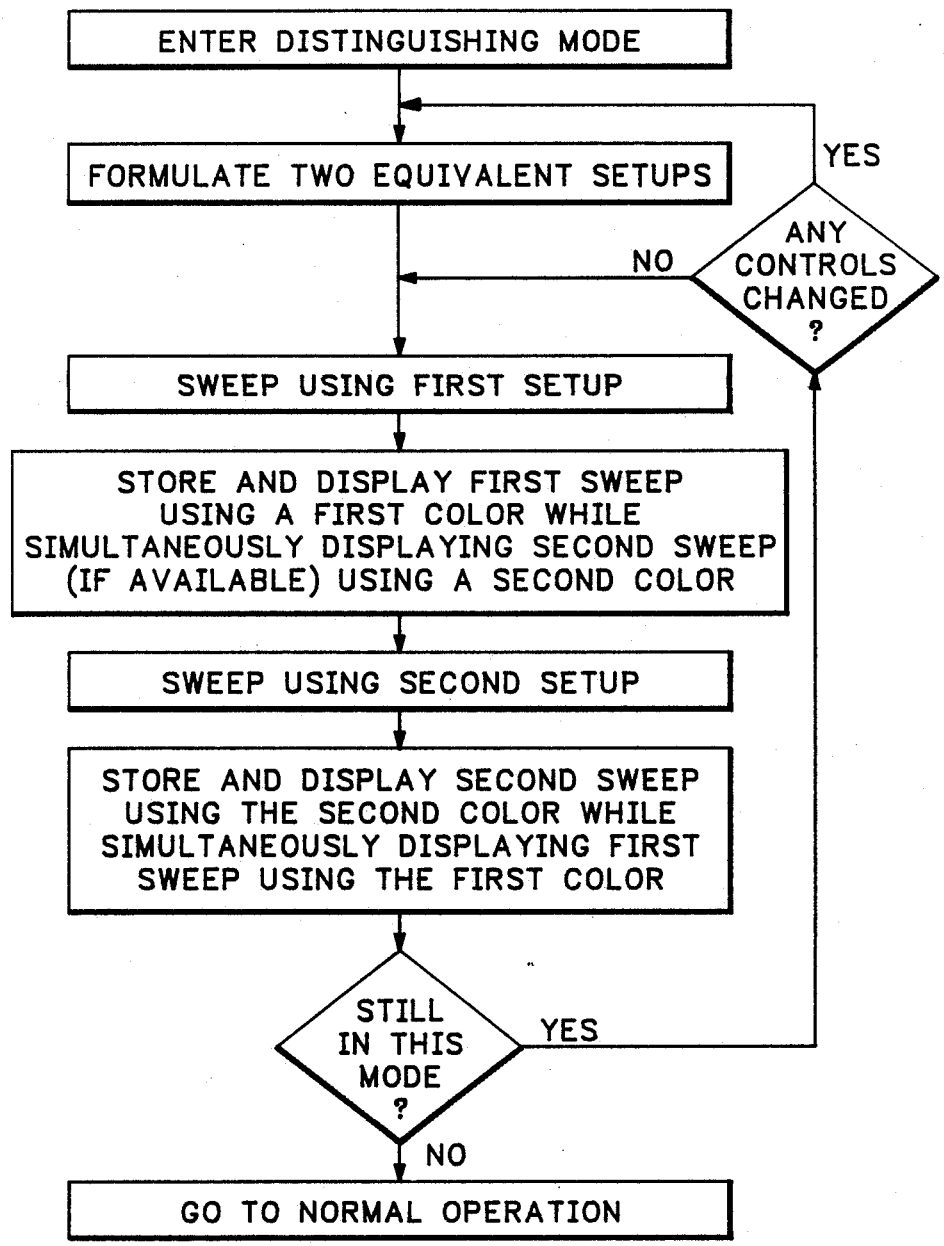
FIG. 2 is a flow chart of the method of the present invention.

FIG. 2 is a flow chart of the method of the present invention. It is entered when an operator of the spectrum analyzer selects this mode of operation. The step of formulating two equivalent setups refers to calculating the necessary values for the first and second local oscillators, such that they examine the frequency spectrum that the operator has indicated and the difference between the two frequencies corresponds to the difference between the two alternative first intermediate frequency filter stages. Thus, as the instrument alternates between these two setups, it switches between the two first intermediate filters and makes corresponding changes to both local oscillator frequencies. This causes the real responses to maintain their original horizontal location when these changes are made, while spurious responses move to different horizontal locations.

The spectrum analyzer then generates a sweep using one of these equivalent, but different, setups. The results of this sweep are both stored and displayed using a first color. The first time through this loop, there is no second sweep to display simultaneously. On subsequent passes through the loop, the alternate sweep, which was stored on the preceding sweep, will be displayed simultaneously.

The spectrum analyzer then generates a sweep using the other one of the equivalent, but different, setups. The results of this sweep are also both stored and displayed using a second color. Simultaneously, the preceding sweep, taken using the other setup, is displayed overlaid with the current sweep.

If during this process the operator has indicated a desire to leave this mode, an exit from this mode is accomplished. If not, the program next looks to see if "Any Controls Changed?". If any controls have changed, two new equivalent setups are formulated corresponding to the new settings. Otherwise, the two setups already formulated are used again.

The invention may be practiced with any sweeping spectrum analyzer whose front end is capable of being controlled so as to produce two sweeps of the same frequency range by two different sets of local oscillator settings and whose memory can accommodate the simultaneous storage of two sets of sweep data. However, a color display greatly enhances the benefit of using this method, and some further capabilities, to be discussed further below, make the method work even better.

While it is not essential, it is desirable to be able to align the two displays, the stored one and the one currently being generated, precisely on top of each other for better clarity in ascertaining where they coincide and where they do not. Since the gain and/or attenuation of the various portions of the front end of the analyzer are usually at least slightly different for each of the two setups, for an optimal display, it is best to use a data comparison algorithm to sense this difference in gain through the two setups and compensate for it, either by adjusting the gain itself or by manipulating the resulting data with the processor.

Figure 1:
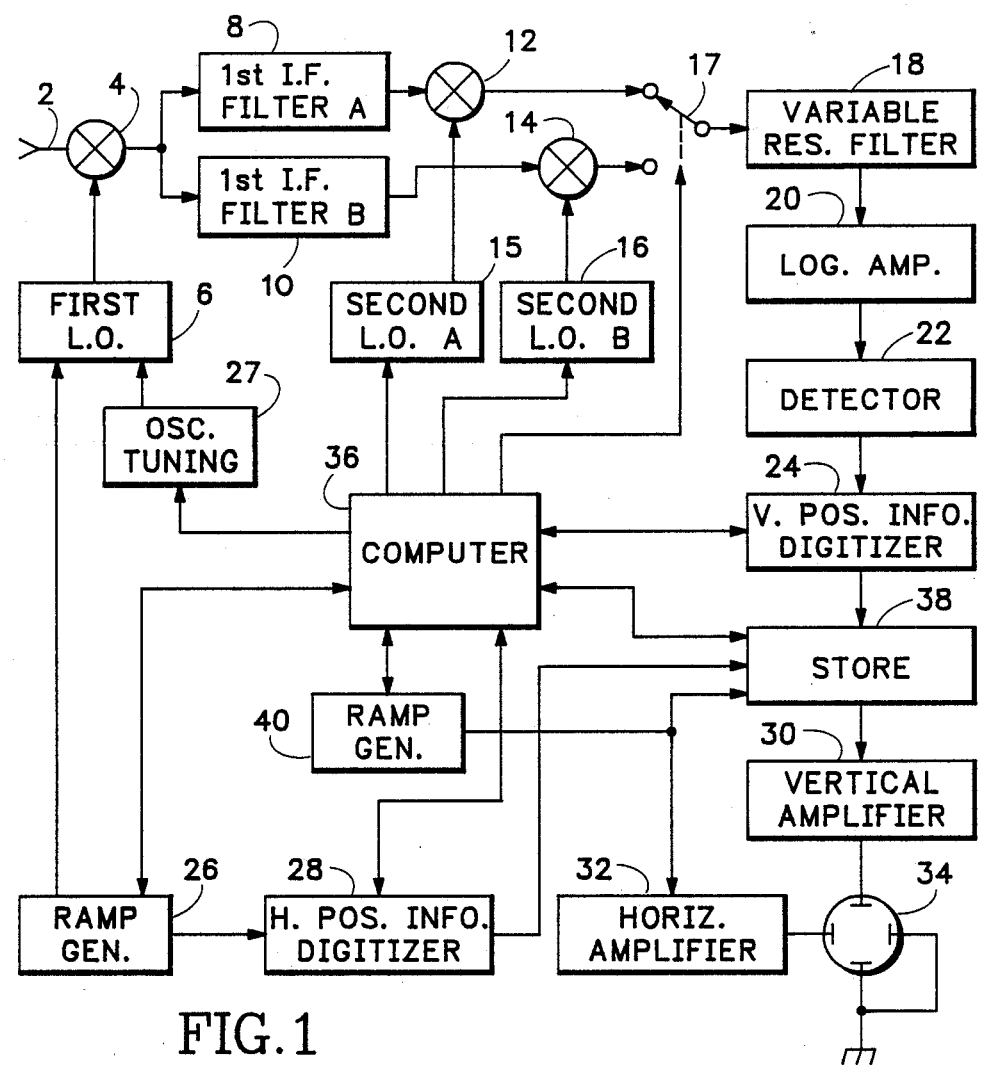
FIG. 1 is a simplified block diagram of a typical superheterodyne spectrum analyzer.
Figure 3:
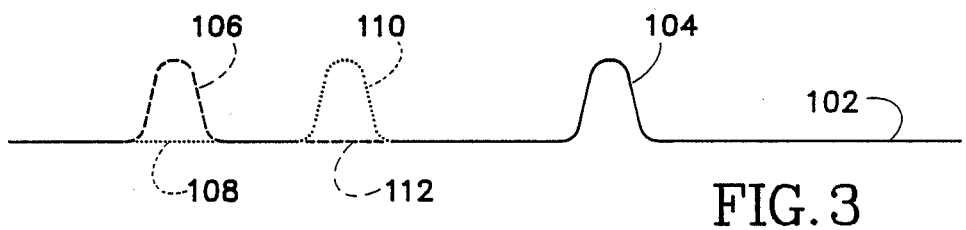
FIG. 3 is an idealized representation of a spectrum analyzer display generated according to the method of the present invention.

FIG. 3 shows an idealized representation of a spectrum analyzer display generated according to the method of the present invention. An actual display would have a lot more noise, especially along the baseline 102. The baseline 102 and real peak 104 of these overlaid sweeps is represented by one visual indication, while spurious peaks 106,110 and the baselines under them 108,112 are represented by a different visual indication.

The use of color, while not essential, is highly preferable for making clear the regions where the two displays overlap. The technology used to produce the colors, and the choice of colors, should permit two different colors to combine to produce a third color. Using such a system, if one of the sweeps is displayed in red and the other in green, the regions of their overlap will be yellow. FIG. 3 can be viewed as a representation of such colors, as follows: If dashes are red and dots are green, then the solid line where they are overlaid is yellow. Most of the baseline 102 and the real peak 104 would appear as yellow, where the red and green overlap. The spurious peak at 106 and the baseline at 112 under another spurious peak are red, while the spurious peak at 110 and the baseline at 108 under the first spurious peak are green.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

We claim:

1. A method for distinguishing between real and spurious responses in a swept frequency spectrum analyzer, comprising the steps of:
    formulating two setups for the spectrum analyzer such that both setups produce a similar response for input signals that are mixing with a desired harmonic of a first local oscillator;
    alternating on each sweep of the swept frequency spectrum analyzer which of the two formulated setups is used;
    storing and displaying in real time each sweep as it is generated; and
    simultaneously displaying the results of the previous sweep overlaid with each sweep displayed in real time.

2. A method as recited in claim 1 wherein a first color is used for displaying each sweep associated with a first of the two formulated setups and a second color is used for displaying each sweep associated with a second of the two formulated setups.

3. A method as recited in claim 1 further comprising the step of adjusting a gain control as necessary to keep the sweeps resulting from the two formulated setups equal in amplitude.

4. A method as recited in claim 1 further comprising the step of digitizing the sweeps, such digitizing step being preliminary to the storing and displaying step.

5. A method as recited in claim 2 further comprising the step of adjusting a gain control as necessary to keep the sweeps resulting from the two formulated setups equal in amplitude.

6. A method as recited in claim 2 further comprising the step of digitizing the sweeps, such digitizing step being preliminary to the storing and displaying step.

* * * * *